(12) United States Patent
Menut et al.

(10) Patent No.: US 6,670,657 B2
(45) Date of Patent: Dec. 30, 2003

(54) INTEGRATED CIRCUIT HAVING PHOTODIODE DEVICE AND ASSOCIATED FABRICATION PROCESS

(75) Inventors: Olivier Menut, Grenoble (FR); Yvon Gris, Tullins (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/044,286

(22) Filed: Jan. 11, 2002

(65) Prior Publication Data

US 2002/0113233 A1 Aug. 22, 2002

(30) Foreign Application Priority Data

Jan. 12, 2001 (FR) .............................. 01 00420

(51) Int. Cl.[7] ......................................... H07L 21/8238
(52) U.S. Cl. .................... 257/225; 257/53; 257/54; 257/55; 257/56; 257/183; 257/183.1; 257/184; 257/185; 257/186; 257/187; 257/188; 257/189; 257/190; 257/226; 257/227; 257/228; 257/229; 257/230; 257/231; 257/232; 257/233; 257/234; 257/277; 257/292; 257/430; 438/59; 438/81; 438/96
(58) Field of Search ............................... 257/53–56, 183, 257/183.1, 184–190, 225–234, 277, 292, 436; 438/59, 81, 96

(56) References Cited

U.S. PATENT DOCUMENTS 5,307,169 A  4/1994  Nagasaki et al.

6,318,906 B1 * 11/2001  Ishizaka ..................... 385/88

FOREIGN PATENT DOCUMENTS

WO       WO99/48152       9/1999

OTHER PUBLICATIONS

"One–Device CMOS Dram Cell with Buried Poly Trench and Drain Reach Through," IBM Technical Disclosure Bulletin, pp. 451–452, vol. 30, No. 11, Apr. 1988.
"Vertical Conducting Connection to a Poly–Si Trench In Si," IBM Technical Disclosure Bulletin, pp. 310–312, vol. 31, No. 12, May 1989.
Preliminary Search Report dated Oct. 19, 2001 for French Patent Application No. 0100420.

* cited by examiner

*Primary Examiner*—Kamand Cuneo
*Assistant Examiner*—Lisa Kilday
(74) *Attorney, Agent, or Firm*—Lisa K. Jorgenson; Stephen Bongini; Fleit, Kain, Gibbons, Gutman, Bongini & Bianco P.L.

(57) ABSTRACT

An integrated circuit is provided that includes a substrate incorporating a semiconductor photodiode device having a p-n junction. The photodiode device includes at least one capacitive trench buried in the substrate and connected in parallel with the junction. In a preferred embodiment, the substrate is formed from silicon, and the capacitive trench includes an internal doped silicon region partially enveloped by an insulating wall that laterally separates the internal region from the substrate. Also provided is a method for fabricating an integrated circuit including a substrate that incorporates a semiconductor photodiode device having a p-n junction.

14 Claims, 2 Drawing Sheets

INTEGRATED CIRCUIT HAVING PHOTODIODE DEVICE AND ASSOCIATED FABRICATION PROCESS

CROSS-REFERENCE TO RELATED APPLICATIONS

This application is based upon and claims priority from prior French Patent Application No. 01-00420, filed Jan. 12, 2001, the entire disclosure of which is herein incorporated by reference.

BACKGROUND OF THE INVENTION

1. Field of the Invention

The present invention relates to integrated circuits, and more specifically to integrated circuits that include photodiode-type semiconductor devices.

2. Description of Related Art

To produce a good photodiode is tricky. This is because it has to be sensitive to light and only the space charge region of the junction is capable of collecting the carriers generated by the light excitation, because of the electric field existing in this region. Now, a photodiode is more sensitive the larger the space charge region. This means that the doping gradient at the junction is low. However, if the doping gradient is low, the capacitance of the junction is also low. Now, the role of a photodiode is to store, in this junction capacitor, the carriers generated in the space charge region.

The solution normally used consists in increasing the doping gradient of the junction and the voltage applied to this junction. It is thus possible to obtain a wide space charge region combined with a high junction capacitance. Typically, a voltage of greater than 5 volts must be applied if the doping levels are high. However, current submicron integrated circuits do not allow high voltages to be used since. In these technologies, the maximum supply voltage is less than 3.3 volts.

SUMMARY OF THE INVENTION

In view of these drawbacks, it is an object of the present invention to overcome the above-mentioned drawbacks and to decorrelate the doping gradient of the junction from the capacitance of the junction.

Another object of the present invention is to reduce the doping gradient at the junction so as to obtain a large extension of the space charge region even for low applied voltages.

Yet another object of the present invention is to increase the capacitance associated with the junction, while neither increasing the footprint nor reducing the sensitivity of the photodiode for a given surface area.

A further object of the present invention is to produce a single-crystal substrate that allows the subsequent formation of an epitaxial silicon layer free of crystal defects, in which layer a junction can be formed.

One embodiment of the present invention provides an integrated circuit that includes a substrate incorporating a semiconductor photodiode device having a p-n junction. The photodiode device includes at least one capacitive trench buried in the substrate and connected in parallel with the junction. In a preferred embodiment, the substrate is formed from silicon, and the capacitive trench includes an internal doped silicon region partially enveloped by an insulating wall that laterally separates the internal region from the substrate.

Another embodiment of the present invention provides a method for fabricating an integrated circuit including a substrate that incorporates a semiconductor photodiode device having a p-n junction. According to the method, there is produced an initial single-crystal substrate having locally a capacitive trench emerging at the surface of the initial substrate and forming a discontinuity in the crystal lattice. The initial substrate is recessed at the trench, and the crystal lattice is amorphized around the periphery of the recess. A layer of amorphous material having the same chemical composition as the initial substrate is deposited, and a thermal annealing is performed in order to recrystallize the amorphous material so as to be continuous with the single-crystal lattice of the initial substrate. An upper substrate layer is grown epitaxially. In one preferred method, the junction is formed by $n^+$-type surface codiffusion of arsenic and phosphorus.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1A:
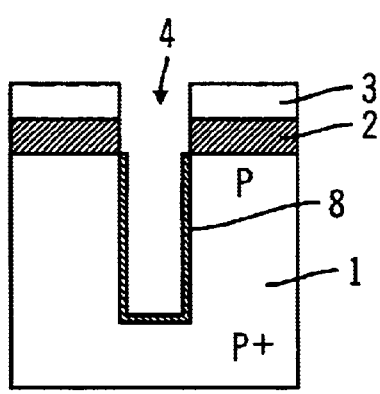
FIGS. 1a to 1h illustrate a process for fabricating a photodiode device according to one embodiment of the present invention.

Preferred embodiments of the present invention will be described in detail hereinbelow with reference to the attached drawings.

One preferred embodiment of the present invention provides an integrated circuit that includes a substrate incorporating a semiconductor device of the photodiode type having a p-n junction. The device includes a capacitive trench buried in the substrate and connected in parallel with the junction.

Preferably, the junction has a low doping level or a low doping gradient, so that the length of the space charge region is greater than 1 micron even for low reverse voltages (for example, of less than 1 volt). For example, this can be achieved by a doping of less than $10^{15}$ at/cm$^3$ in the case of a sharp junction with low doping on only one side or else by a doping gradient of less than $10^{20}$ at/cm$^3$ in the case of a junction with linear doping. Moreover, this parameter is decorrelated with the capacitance parameter. In this regard, the capacitance associated with the junction is increased by virtue of the presence of the buried capacitive trench, with neither an increase in surface area of the photodiode nor a loss of sensitivity.

According to one embodiment, the substrate is formed from silicon and the capacitive trench includes an internal doped silicon region partially enveloped by an insulating wall laterally separating the internal region from the substrate and surmounted by an upper doped silicon region, this upper region being in contact with the junction. Preferably, the substrate has a highly doped lower part with a p-type conductivity, for example with a dopant concentration of greater than $10^{18}$ at/cm$^3$ (such as a dopant concentration equal to $10^{19}$ at/cm$^3$). The substrate also preferably has an upper part of p-type conductivity, less doped than the lower part. Also preferably, The internal region and the upper region of the capacitive trench have an n-type conductivity, and the region of the junction having the n-type conductivity includes a lower region of n-type conductivity in contact with the upper region of the trench, and an upper region of n-type conductivity but more highly doped than the lower region. The use of a highly doped p-type substrate is not required, but it does allow the input resistances and the noise to be reduced.

Processes for fabricating semiconductor components may destroy the crystal continuity of the surface of part of the initial single-crystal semiconductor substrate. This is especially the case when a trench is produced. The semiconductor substrate has, at the position of the trench, a different material without any crystal structure. Consequently, the surface of that part of the substrate occupied by the trench cannot be used to produce semiconductor devices.

The present invention therefore also provides processes for fabricating an integrated circuit that includes a substrate incorporating a semiconductor device of the photodiode type having a p-n junction. According to the process of a preferred embodiment, an initial single-crystal substrate is produced, which has locally a capacitive trench emerging at the surface of the initial substrate and forming a discontinuity in the crystal lattice. The initial substrate is recessed at the trench, and the crystal lattice is amorphized around the periphery of the recess. A layer of amorphous material having the same chemical composition as that of the initial substrate is next deposited on the structure, and then the structure is thermally annealed in order to recrystallize the amorphous material so as to be continuous with the single-crystal lattice of the initial substrate. An upper substrate layer, in which the junction connected in parallel with the capacitive trench has been produced, is grown epitaxially.

According to one embodiment, prior or subsequent to the thermal annealing, a surface planarization step is performed (for example, a chemical-mechanical polishing operation). Preferably, the junction is formed by $n^+$-type surface codiffusion of arsenic and phosphorus so as to reduce the doping gradient of the junction.

According to one embodiment, the amorphization step includes a localized ion implantation around the recess by a masking operation.

According to one embodiment, in the step of producing the initial substrate, a first layer of a first material and a second layer of a second material are deposited in succession on the initial substrate and then a trench is etched, and filled with a fill material. And in the step of recessing the initial substrate, the first layer and an upper portion of the trench fill material are selectively etched with respect to the second layer so as to form lateral cavities and the recess at the crystal discontinuity, and the second layer is removed.

Preferably, in the step of producing the initial substrate, the filling of the trench includes lining the walls of the trench with oxide by thermal oxidation, depositing highly doped polycrystalline silicon in the trench so as to fill it, and etching the polycrystalline silicon deposited previously so that the fill level of the trench is below the surface of the initial substrate.

One exemplary embodiment of a process for fabricating a photodiode device in accordance with the present invention will now be described in detail with reference to FIGS. 1a–1h. FIG. 1a shows the starting substrate of the process, or "initial substrate", which includes a trench in this embodiment. The initial substrate 1 has a $p^+$-doped lower part (e.g., with a dopant concentration of $10^{19}$ at/cm$^3$), and a p-doped upper part grown epitaxially on the lower part (e.g., with a dopant concentration of $5 \times 10^{14}$ at/cm$^3$).

The trench is formed, according to one embodiment of the present invention, by first depositing a silicon oxide layer 2 on the initial single-crystal silicon substrate 1. The thickness of this layer 2 may vary between 0.01 microns and 1 micron, and is preferably about 2000 Å. Next, a silicon nitride layer 3 is deposited on the oxide 2. The thickness of this layer 3 may also vary between 0.01 microns and 1 micron, and is also preferably about 2000 Å. Next, the nitride 3, then the oxide 2, and finally the single-crystal silicon of the substrate 1 are conventionally etched with the aid of a photolithography operation in order to form the trench 4.

The trench 4 preferably has a depth of approximately 10 µm and a variable width, preferably less than 1 µm. Next, a controlled thermal oxidation is carried out so as to deposit on the walls of the trench 4 a silicon oxide layer 8 having a thickness of between 40 and 1000 Å, preferably between 50 and 300 Å. This produces the device illustrated in FIG. 1a.

Figure 1B:
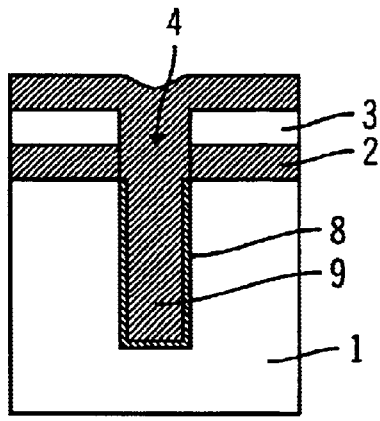

Next, highly $n^+$-doped polycrystalline silicon 9 is deposited on the wafer so as to fill the trench 4. The doping of the silicon is preferably carried out in situ. A device as illustrated in FIG. 1b is then obtained.

Figure 1C:
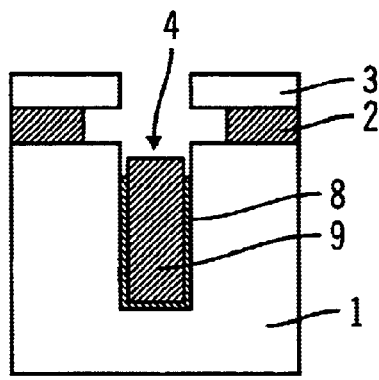

Next, the deposited polycrystalline silicon 9 is etched, at least so as to remove it from the surface of the wafer. Moreover, this etching is carried out until the level of the polycrystalline silicon in the trench 4 is below the surface of the initial substrate 1. Then, a controlled deoxidation is performed so as to form, under the silicon nitride layer 3, two lateral cavities of given width in the oxide layer 2, as illustrated in FIG. 1c. Some of the silicon oxide 8 in the trench 4 is also removed.

This deoxidation is preferably carried out by isotropic etching using hydrofluoric acid or by isotropic plasma etching using fluorine. The device illustrated in FIG. 1c, in which the trench is lined with a silicon oxide layer 8 whose height is less than the height of the doped polycrystalline silicon layer 9 in the trench 4, is then obtained. Two lateral cavities of given width appear below the silicon nitride layer 3 and in the silicon oxide layer 2.

Figure 1D:
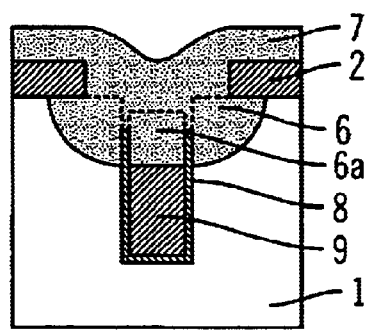
Figure 1E:
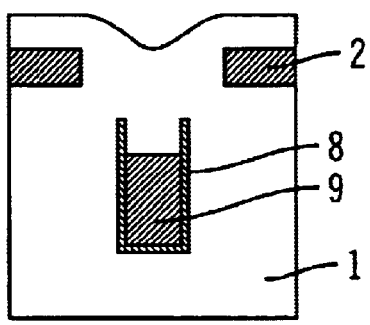

Next, the silicon nitride mask 3 is conventionally removed. The exposed silicon is then amorphized. The silicon exposed at this stage of the process is the single-crystal silicon of the substrate 1 together with the emergent portion of doped polycrystalline silicon 9 in the trench 4. Thus, amorphous silicon regions 6 and 6a are created, as illustrated in FIG. 1d. The localized simultaneous amorphization of the regions 6 and 6a is self-aligned with respect to the trench and is carried out conventionally by destroying the crystal lattice of the silicon and of the polycrystalline silicon 6a (for example, by the implantation of heavy particles such as ions). Within the context of the present invention, it is especially preferred to implant fluoride ions.

Next, an amorphous silicon layer 7 is deposited over the entire surface of the wafer so as to at least fill the lateral cavities and the recess above the trench 4. The deposited amorphous layer 7 therefore acts as a link between the regions 6 and 6a and as a means of filling in the surface. The amorphous silicon is preferably deposited conventionally at low temperature. For example, it is possible to use an LPCVD (low-pressure chemical vapor deposition) furnace, and inject silane at a sufficiently low temperature (for example, less than 600° C., and typically less than 400° C.). The device illustrated in FIG. 1d is then obtained. As shown, the device includes, in a trench 4 etched in the substrate 1, a polycrystalline silicon block 9 partially enveloped in a silicon oxide layer 8. The height of this block, which is less than that of the trench 4, is also less than the height of the silicon oxide envelope 8. This element is surmounted by an amorphous silicon region including the amorphized silicon regions 6 and 6a and the deposited amorphous silicon 7.

A thermal annealing operation is then carried out so as to restore the crystal structure of the amorphous silicon. The thermal annealing allows the amorphous silicon to recrystallize, by the epitaxial regrowth of the amorphous silicon 6 and 7 starting from the single-crystal silicon of the initial substrate 1. The restructuring of the single-crystal silicon lattice results in the device of FIG. 1e, in which the previous amorphous silicon layer now merges with the single-crystal silicon of the substrate 1.

It should be noted that, according to preferred embodiments of the present invention, the region 6 is spatially limited and the boundary between this region 6 and the substrate 1 is easily localized by ion implantation. This boundary is moreover a "soft" boundary. That is, the transition from the single-crystal Si state to the amorphous Si state is very gradual. These characteristics result in the region 6 being recrystallized very efficiently and without any defects, which is not easily achievable with a large area to be recrystallized.

In addition, the amorphization of the region 6a prevents crystal defects from "rising" into the single-crystal layer from the polycrystalline silicon.

Next, a chemical-mechanical polishing operation is carried out, stopping on the silicon oxide layer 2, in order to remove the recrystallized silicon layer on the surface of the wafer. The silicon oxide layer 2 is then conventionally removed. Next, in order to planarize the surface, the wafer is subjected to a final chemical-mechanical polishing operation.

Figure 1F:
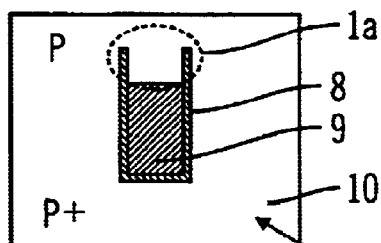

After the planarizing of the surface of the substrate, a final single-crystal silicon substrate 10 is obtained, as illustrated in FIG. 1f. The perfectly planar and uniform single-crystal surface of this substrate 10 allows defect-free epitaxial growth of single-crystal silicon. Preferably, the thickness of the substrate 10 above the trench is about 0.2 microns and is p-doped with a dopant concentration of about $5 \times 10^{14}$ at/cm$^3$. Moreover, the substrate includes a buried capacitive trench TRC made of highly doped polycrystalline silicon 9 partially enveloped by a silicon oxide wall 8 that separates it laterally from the substrate 1. Above this buried capacitive trench and in the substrate 1, there remains a doped region 1a, of the same conductivity as the polycrystalline silicon 9. This region corresponds to the amorphized polycrystalline silicon region 6a and to the silicon portion 7 doped by the diffusion of dopants during the annealing.

The localized destruction of the crystal lattice that is performed according to the present invention is particularly advantageous in the case of capacitive trenches, as it allows the polycrystalline silicon 9 (the entire capacitor) to be buried by controlled etching of the sidewall oxide 8, without it being necessary to provide an additional oxide.

Figure 1G:
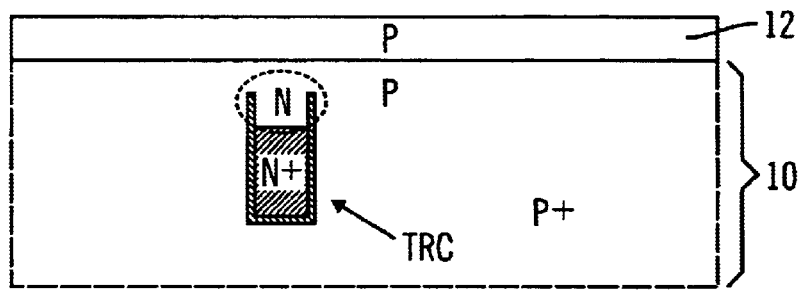

As shown in FIG. 1g, the process is continued by epitaxial growth on the surface of the substrate 10 of an upper substrate layer 12, formed from p-doped silicon and preferably having a thickness of approximately two microns. It is in this layer 12 that the junction will be formed.

Figure 1H:
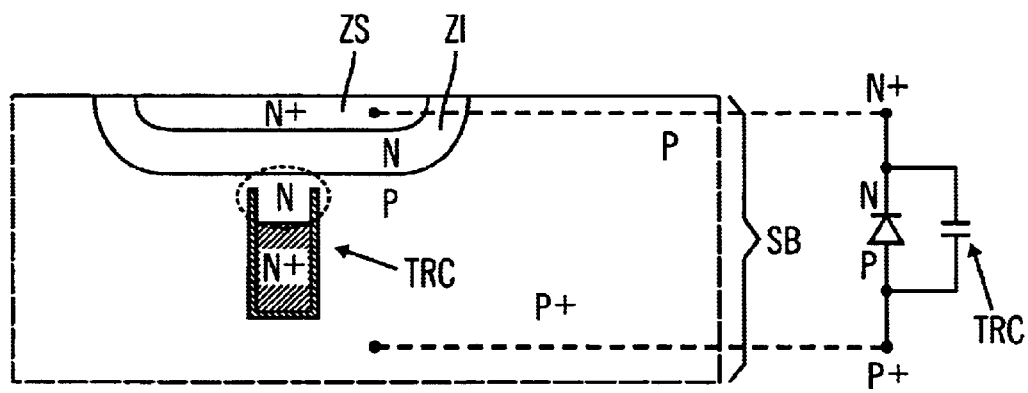

More specifically, as illustrated in FIG. 1h, the substrate SB, which is formed from the substrate 10 and the layer 12, incorporates the capacitive trench TRC and the junction. The upper region 1a of the trench comes into direct contact with the n-doped lower region LR of the p-n junction. This lower region LR is obtained, for example, by phosphorus implantation with a concentration of approximately $3 \times 10^{15}$ at/cm$^2$ with an energy of approximately 100 keV. The n-type region of the junction also preferably has an n-type upper region UR more highly doped than the lower region LR. For example, in one embodiment this region UR is formed by arsenic implantation with a concentration of approximately $5 \times 10^{15}$ at/cm$^2$ with an energy of approximately 60 keV. The codiffusion of the dopants is achieved by a thermal annealing operation, for example at a temperature of 1000° C. for 20 minutes.

The right side of FIG. 1h shows the equivalent circuit diagram of the photodiode, showing that the capacitive trench is connected in parallel with the p-n junction.

The carriers generated are collected and handled in a known conventional manner, for example using a MOS transistor or else a charge-coupled device (CCD).

It should also be noted that should there be matricing of this photodiode, the presence of the buried trench does not create a light-insensitive region.

The present invention can also be embodied in an information processing system that includes at least one integrated circuit. In such embodiments, the integrated circuit includes a substrate incorporating a semiconductor photodiode device having a p-n junction, and the photodiode device includes at least one capacitive trench buried in the substrate and connected in parallel with the junction. Preferably, the substrate is formed from silicon, and the capacitive trench includes an internal doped silicon region partially enveloped by an insulating wall that laterally separates the internal region from the substrate.

In some embodiments, the capacitive trench is surmounted by an upper doped silicon region that is in contact with the junction. In one preferred embodiment, the substrate has a highly doped lower part with p-type conductivity and an upper part of p-type conductivity that is less doped than the lower part, and the internal region and the upper region of the capacitive trench have n-type conductivity. Preferably, the region of the junction having n-type conductivity includes a lower region of n-type conductivity that is in contact with the upper region of the trench, and an upper region of n-type conductivity that is more highly doped than the lower region.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated circuit comprising:
   a substrate incorporating a semiconductor photodiode device having a p-n junction,
   wherein the photodiode device includes at least one capacitive trench that is completely buried in the substrate and connected in parallel with the junction.

2. The integrated circuit according to claim 1, wherein the substrate is formed from silicon, the buried capacitive trench includes an internal doped silicon region partially enveloped by an insulating wall that laterally separates the internal region from the substrate, and both the insulating wall and the internal region are located entirely below the surface of the substrate.

3. The integrated circuit according to claim 2, wherein the buried capacitive trench is surmounted by an upper doped silicon region, the upper region being in contact with the junction and being located entirely below the surface of the substrate.

4. The integrated circuit according to claim 3, wherein the substrate has a highly doped lower part with p-type conductivity and an upper part of p-type conductivity that is less doped than the lower part, and the internal region and the upper region of the buried capacitive trench have n-type conductivity.

5. The integrated circuit according to claim 4, wherein the region of the junction having n-type conductivity includes a lower region of n-type conductivity that is in contact with the upper region of the buried capacitive trench, and an upper region of n-type conductivity that is more highly doped than the lower region.

6. The integrated circuit according to claim 1, wherein no portion of the capacitive trench is located above the p-n junction of the photodiode device.

7. An integrated circuit comprising:

a substrate incorporating a semiconductor photodiode device having a p-n junction, wherein the photodiode device includes at least one capacitive trench connected in parallel with the junction, the capacitive trench includes an internal doped silicon region partially enveloped by an insulating wall that laterally separates the internal region from the substrate, and both the insulating wall and the internal region are located entirely below the p-n junction of the photodiode device.

8. An information processing system including at least one integrated circuit, the integrated circuit comprising:

a substrate incorporating a semiconductor photodiode device having a p-n junction, wherein the photodiode device includes at least one capacitive trench that is completely buried in the substrate and connected in parallel with the junction.

9. The information processing system according to claim 8, wherein the substrate is formed from silicon, the buried capacitive trench includes an internal doped silicon region partially enveloped by an insulating wall that laterally separates the internal region from the substrate, and both the insulating wall and the internal region are located entirely below the surface of the substrate.

10. The information processing system according to claim 9, wherein the buried capacitive trench is surmounted by an upper doped silicon region, the upper region being in contact with the junction and being located entirely below the surface of the substrate.

11. The information processing system according to claim 10, wherein the substrate has a highly doped lower part with p-type conductivity and an upper part of p-type conductivity that is less doped than the lower part, and the internal region and the upper region of the buried capacitive trench have n-type conductivity.

12. The information processing system according to claim 11, wherein the region of the junction having n-type conductivity includes a lower region of n-type conductivity that is in contact with the upper region of the buried capacitive trench, and an upper region of n-type conductivity that is more highly doped than the lower region.

13. The information processing system according to claim 8, wherein no portion of the capacitive trench is located above the p-n junction of the photodiode device.

14. The information processing system according to claim 8, wherein the capacitive trench includes an internal doped silicon region partially enveloped by an insulating wall that laterally separates the internal region from the substrate, and both the insulating wall and the internal region are located entirely below the p-n junction of the photodiode device.

* * * * *